United States Patent
Yamaoka et al.

(10) Patent No.: US 9,928,900 B2
(45) Date of Patent: Mar. 27, 2018

(54) LOW POWER SEMICONDUCTOR MEMORY DEVICE

(71) Applicant: Renesas Electronics Corporation, Koutou-ku, Tokyo (JP)

(72) Inventors: Masanao Yamaoka, Hachioji (JP); Koichiro Ishibashi, Warabi (JP); Shigezumi Matsui, Nishitokyo (JP); Kenichi Osada, Kawasaki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/478,237

(22) Filed: Apr. 3, 2017

(65) Prior Publication Data
US 2017/0206951 A1  Jul. 20, 2017

Related U.S. Application Data

(60) Division of application No. 14/940,654, filed on Nov. 13, 2015, now Pat. No. 9,754,659, which is a (Continued)

(30) Foreign Application Priority Data

Oct. 23, 2001  (JP) ................... 2001-324357

(51) Int. Cl.
G11C 5/06  (2006.01)
G11C 11/419  (2006.01)

(52) U.S. Cl.
CPC .................. *G11C 11/419* (2013.01)

(58) Field of Classification Search
CPC . G11C 11/419; G11C 11/417; G11C 11/4125; G11C 5/146; G11C 5/147; G11C 2207/2227

(Continued)

(56) References Cited

U.S. PATENT DOCUMENTS 4,858,182 A * 8/1989 Pang ................. G11C 7/20
  365/156
5,257,239 A * 10/1993 Guo ................. G11C 7/20
  365/189.05

(Continued)

FOREIGN PATENT DOCUMENTS

JP   63-049812 A   3/1988
JP   04-165670 A   6/1992

(Continued)

OTHER PUBLICATIONS

Office Action dated Jan. 30, 2018, in Japanese Patent Application No. 2017-076167.

*Primary Examiner* — Tha-O H Bui
(74) *Attorney, Agent, or Firm* — Shapiro, Gabor and Rosenberger, PLLC

(57) ABSTRACT

A semiconductor device having static memory cells is designed to reduce leakage current and power consumption. The static memory cells are coupled to word lines and bit lines, and the word lines are coupled to word drivers. A first P channel MOS transistor (MOS power switch) has a gate coupled to receive a first control signal, and a second P channel MOS transistor (MOS power switch) has a gate coupled to receive a second control signal different from the first control signal. Source-drain paths of the first and second P channel MOS transistors (MOS power switches) are coupled to respective voltage supply points for different parts of the semiconductor device, such as voltage supply points for the memory cells and the word drivers, or voltage supply points for a logic circuit and the word drivers.

23 Claims, 14 Drawing Sheets

Related U.S. Application Data continuation of application No. 14/245,124, filed on Apr. 4, 2014, now Pat. No. 9,214,221, which is a continuation of application No. 13/110,068, filed on May 18, 2011, now Pat. No. 8,711,607, which is a continuation of application No. 12/629,981, filed on Dec. 3, 2009, now Pat. No. 7,961,545, which is a continuation of application No. 12/325,783, filed on Dec. 1, 2008, now Pat. No. 7,646,662, which is a continuation of application No. 11/833,190, filed on Aug. 2, 2007, now Pat. No. 7,474,584, which is a continuation of application No. 11/500,339, filed on Aug. 8, 2006, now Pat. No. 7,272,068, which is a continuation of application No. 11/152,110, filed on Jun. 15, 2005, now Pat. No. 7,099,183, which is a continuation of application No. 10/671,513, filed on Sep. 29, 2003, now Pat. No. 6,914,803, which is a continuation of application No. 10/274,985, filed on Oct. 22, 2002, now Pat. No. 6,657,911.

(58) Field of Classification Search
USPC .......................................................... 365/72
See application file for complete search history.

(56) References Cited

U.S. PATENT DOCUMENTS

| | | | |
|---|---|---|---|
| 5,274,601 A | 12/1993 | Kawahara et al. | |
| 5,293,336 A | 3/1994 | Ishii et al. | |
| 5,514,880 A | 5/1996 | Nishimura et al. | |
| 5,592,430 A | 1/1997 | Ohtsuki | |
| 5,668,770 A | 9/1997 | Itoh et al. | |
| 5,715,191 A | 2/1998 | Yamauchi et al. | |
| 5,724,297 A | 3/1998 | Noda et al. | |
| 5,726,944 A * | 3/1998 | Pelley, III | G11C 5/147 |
| | | | 365/189.15 |
| 5,734,604 A | 3/1998 | Akamatsu et al. | |
| 5,764,566 A | 6/1998 | Akamatsu et al. | |
| 5,894,433 A | 4/1999 | Itoh et al. | |
| 5,969,995 A | 10/1999 | Morishima | |
| 5,970,018 A | 10/1999 | Lwata et al. | |
| 6,031,778 A | 2/2000 | Makino et al. | |
| 6,046,627 A | 4/2000 | Itoh et al. | |
| 6,101,146 A | 8/2000 | Maesako et al. | |
| 6,111,779 A | 8/2000 | You | |
| 6,175,138 B1 | 1/2001 | Noda | |
| 6,188,628 B1 | 2/2001 | Tomotani | |
| 6,335,873 B1 | 1/2002 | Kawaguchi et al. | |
| 6,424,015 B1 | 7/2002 | Ishibashi et al. | |
| 6,426,908 B1 | 7/2002 | Hidaka | |
| 6,545,525 B2 | 4/2003 | Itoh et al. | |
| 6,639,827 B2 | 10/2003 | Clark et al. | |
| 6,738,305 B1 | 5/2004 | Liaw | |
| 6,770,940 B2 | 8/2004 | Yamauchi | |
| 6,914,845 B2 | 7/2005 | Ooishi | |
| 7,023,757 B2 | 4/2006 | Watanabe et al. | |
| 7,031,220 B2 | 4/2006 | Watanabe et al. | |
| 7,092,307 B2 | 8/2006 | Chen et al. | |
| 7,196,960 B2 | 3/2007 | Isoda et al. | |
| 7,474,584 B2 | 1/2009 | Yamaoka et al. | |
| 9,214,221 B2 | 12/2015 | Yamaoka et al. | |

FOREIGN PATENT DOCUMENTS

| | | |
|---|---|---|
| JP | 7-86916 | 3/1995 |
| JP | 07-254284 A | 10/1995 |
| JP | 07-254685 A | 10/1995 |
| JP | 10-116138 A | 5/1998 |
| JP | 10-208473 A | 8/1998 |
| JP | 10-261946 A | 9/1998 |
| JP | 11-039879 A | 2/1999 |
| JP | 11-219589 A | 8/1999 |
| JP | 2000-003593 A | 1/2000 |
| JP | 2000-207884 | 7/2000 |
| JP | 2001-015704 A | 1/2001 |
| JP | 2001-052476 A | 2/2001 |
| JP | 2001-93275 | 4/2001 |

* cited by examiner

| | | Logic_CIR | Logic sw (N1) | SRAM_CIR | SRAM sw (s_sw1, s_sw2) | IO |
|---|---|---|---|---|---|---|
| Pattern1 | Tox Vth | 2.0nm 0.25V, 0.40V | 6.7nm 0.80V | 2.0nm 0.25V, 0.40V | 2.0nm 0.40V | 6.7nm 0.80V |
| Pattern2 | Tox Vth | 2.0nm 0.25V, 0.40V | 6.7nm 0.80V | 2.0nm 0.25V, 0.40V | 6.7nm 0.40V | 6.7nm 0.80V |
| Pattern3 | Tox Vth | 2.0nm 0.25V, 0.40V | 6.7nm 0.80V | 2.0nm 0.25V, 0.40V | 2.0nm 0.40V | 6.7nm 0.80V |

CNTV1

|  |  | Logic_CIR | IO | MAR1 | MAR2 |
|---|---|---|---|---|---|
| Pattern1 | Tox<br>Vth | 2.0nm<br>0.25V, 0.40V | 6.7nm<br>0.80V | 2.0nm<br>0.40V | 2.0nm<br>0.40V |
| Pattern2 | Tox<br>Vth | 2.0nm<br>0.25V, 0.40V | 6.7nm<br>0.80V | 2.0nm<br>0.40V | 6.7nm<br>0.40V |
| Pattern3 | Tox<br>Vth | 2.0nm<br>0.25V, 0.40V | 6.7nm<br>0.80V | 2.0nm<br>0.25V | 2.0nm<br>0.40V |
| Pattern4 | Tox<br>Vth | 2.0nm<br>0.25V, 0.40V | 6.7nm<br>0.80V | 2.0nm<br>0.25V | 6.7nm<br>0.40V |

LOW POWER SEMICONDUCTOR MEMORY DEVICE

BACKGROUND OF THE INVENTION

1. Field of the Invention

The present invention relates to a semiconductor device consolidating a logic circuit and a static memory (SRAM) circuit.

2. Description of the Related Art

Japanese Published Unexamined Patent Application No. Hei 7-86916 discloses a construction in which a logic circuit is provided with a power switch and a MOS transistor constructing the logic circuit is back-gate biased. Japanese Published Unexamined Patent Application No. 2000-207884 discloses a substrate bias control technology for a system LSI operable at a low voltage including a static memory. Japanese Published Unexamined Patent Application No. 2001-93275 discloses a construction in which a logic circuit is provided with a logic power source and a memory circuit is provided with a memory power source.

Currently, semiconductor integrated circuits called a system LSI (Large Scale Integrated Circuit) integrating an SRAM circuit and a logic circuit on the same semiconductor chip are widely manufactured. The SRAM circuit refers to a circuit functioning as a memory by only the circuit including arrayed SRAM memory cells and a peripheral circuit for accessing the memory cells. The logic circuit refers to a circuit subjecting an inputted signal to a specified process for output, other than the memory circuit including arrayed memory cells such as an SRAM, a dynamic memory (DRAM) and a non-volatile memory and a circuit for accessing the memory cells. A circuit holding data such as a flip-flop in the logic circuit is thought to be part of the logic circuit.

A request for low power consumption of the system LSI and finer transistors in the LSI lower the source voltage of the LSI. In a 0.13 µm process, a LSI operated at a source voltage of 1.2V is manufactured. When the source voltage is lowered, the electric current of the MOS transistor is reduced to deteriorate the circuit performance. To prevent the performance from being deteriorated, a LSI lowering the threshold voltage of the MOS transistor is manufactured.

When the threshold value of the MOS transistor is lowered, a leakage current called a sub-threshold current of the MOS transistor is increased. The leakage current continues to flow at the time of operation or non-operation of the circuit. In the standby state, the SRAM does not perform write and read operations, but continues to hold data. The power consumption in the standby state of the system LSI is the leakage current of the MOS transistor in the circuit. When the threshold voltage of the MOS transistor is lowered, the power consumption in the standby state is increased. In the system LSI, the state that the logic circuit is not operated and the SRAM circuit holds data is called a standby state.

The logic circuit is not operated at the time of standby. The logic circuit cuts off the power source using a switch to reduce the leakage current. The SRAM memory cell is of a flip-flop construction. The leak current is relatively small. In the prior art system LSI, the capacitance of the SRAM circuit mounted is not large and the SRAM memory cell is made by the MOS transistor having a high threshold value. The leakage current in the SRAM circuit has not been a problem. However, when the MOS transistor is made finer and a large-capacitance SRAM is mounted on the system LSI so as to lower the threshold voltage of the MOS transistor constructing the SRAM memory cell, the leakage current in the SRAM memory cell cannot be ignored. The logic circuit can reduce the leakage current at the time of standby when the power source is cut off by the switch. The SRAM circuit must hold data in the standby state. The power source cannot be cut off so that the leakage current cannot be reduced. When the voltage is lowered to reduce the threshold voltage of the MOS transistor, the leakage current in the circuit attached for accessing the memory cell in the SRAM circuit is increased.

SUMMARY OF THE INVENTION

The summary of the representative inventions disclosed in this application will be described as follows.

(1) In a LSI consolidating a logic circuit and an SRAM circuit, the power source of the logic circuit is cut off by the switch at the time of standby, and the SRAM circuit controls the substrate voltage of the MOS transistor so as to reduce the leakage current.

(2) The power source of the control circuit for accessing the memory cell in the SRAM circuit is divided to be cut off, reducing the power consumption.

(3) The SRAM circuit is divided so that some SRAMs hold data at the time of standby and other SRAMs not holding data cut off the power source to reduce the leakage current.

DETAILED DESCRIPTION OF THE PREFERRED EMBODIMENTS

Embodiment 1

Figure 1:
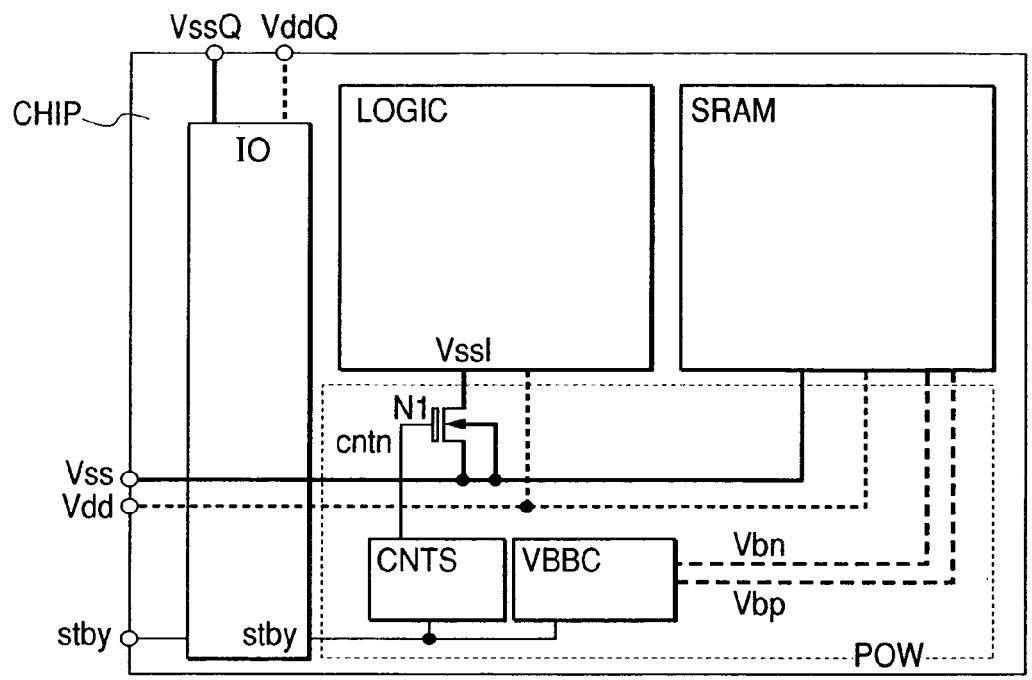
FIG. 1 is a diagram showing an overview of the relation between a logic circuit and an SRAM circuit of a system LSI to which the present invention is applied and power sources thereof.

FIG. 1 schematically shows the entire construction of a LSI consolidating a logic circuit and an SRAM circuit using the present invention. In FIG. 1, a CHIP as the consolidated LSI includes an input/output circuit IO (IO circuit) having power voltage lines VssQ and VddQ from outside as operating voltages; a logic circuit LOGIC executing a predetermined process to data; a static memory circuit SRAM storing data; an nMOS transistor N1 as a switch between a ground voltage line Vss and an operating voltage supply line Vssl on the low voltage side of the logic circuit; a control circuit CNTS to which a signal stby inputted in the standby state is inputted to be connected to the gate electrode of the N1 outputting a signal cntn controlling the N1; and a substrate bias control circuit VBBC controlling substrate voltages Vbn and Vbp of the SRAM when the stby is inputted. Unless otherwise specified, the power source with a symbol starting from Vdd is a power source supplying a high voltage, and the power source with a symbol starting from Vss is a power source supplying a low voltage. An operating voltage difference (VssQ–VddQ) supplied to the IO circuit is typically defined by the standard and is larger than an operating voltage difference (Vss–Vdd) of the logic circuit and the SRAM circuit. By way of example, 3.3V is supplied to the VddQ, 1.2V is supplied to the Vdd, and 0V is supplied to the Vss and the VssQ. The signal stby for use in the control circuit CNTS is used via the IO circuit.

Figure 2:
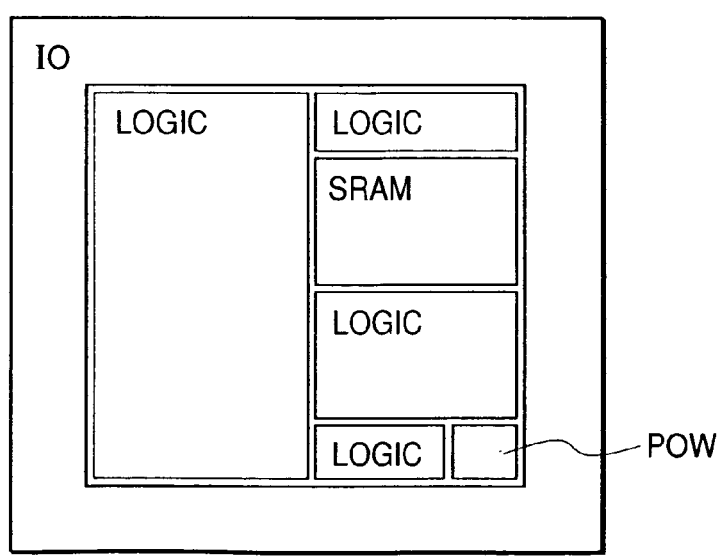
FIG. 2 is a schematic diagram of the layout of the system LSI of FIG. 1.

FIG. 2 shows the layout of the circuit of FIG. 1 on a semiconductor chip. A core circuit (the logic circuits and the SRAM circuit) is arranged so as to be surrounded by the input/output circuit IO (IO circuit). The IO circuit is connected to an input/output pad. A MOS transistor having a gate-insulating film thickness larger than that of the MOS transistor for use in the core circuit is used for the IO circuit. Since a source voltage higher than that of the core circuit is typically applied to the IO circuit, the voltage resistance is required. The power switch, the substrate bias control circuit VBBC, and the power switch control circuit CNTS included in a power source control system POW in FIG. 1 are integrally arranged to increase the integration degree. It is advantageous when the transistor size (the channel length and the channel width) is different from that of the logic circuit and the SRAM circuit. The substrate bias control circuit has a control switch and a charge pump circuit.

The nMOS transistor having a large insulating film thickness for use in the IO circuit is used for the N1 in FIG. 1. The substrate voltage of the power switch N1 is connected to the source side. Unless otherwise specified, the substrate voltages of the N channel type and the P channel type MOS transistors constructing the switch connected to the power source are connected to the source voltages of the transistors. Use of the thick-film MOS transistor is effective for the tunnel leakage current prevention of the gate. Since the voltage resistance is excellent, the voltage applied to the gate of the switch N1 can be larger than the operating voltage and the leakage current when the nMOS is allowed to be nonconductive can be reduced. When there is only one film thickness of the transistor constructing the LSI and the MOS transistor for use in the IO circuit cannot be used in the core part for design, a MOS transistor having a small insulating film thickness can be used as a switch. In this case, the leakage current cannot be cut off completely by the switch N1. When the leak current is within an allowable range, the MOS switch may be only made by the thin-film MOS transistor. When the leakage current exceeds the allowable value, the substrate voltage of the logic circuit and the switch N1 or only the switch N1 must be controlled to reduce the leakage current.

The nMOS transistor is used as a switch cutting off the power source. The nMOS has a flowing current larger than that of the pMOS. When attempting to flow the same current, the switch size can be reduced. When the switch size is not considered due to enough area, the switch of the pMOS cutting off the power source Vdd can be inserted without inserting the switch of the nMOS cutting off the ground power source Vss.

Figure 3:
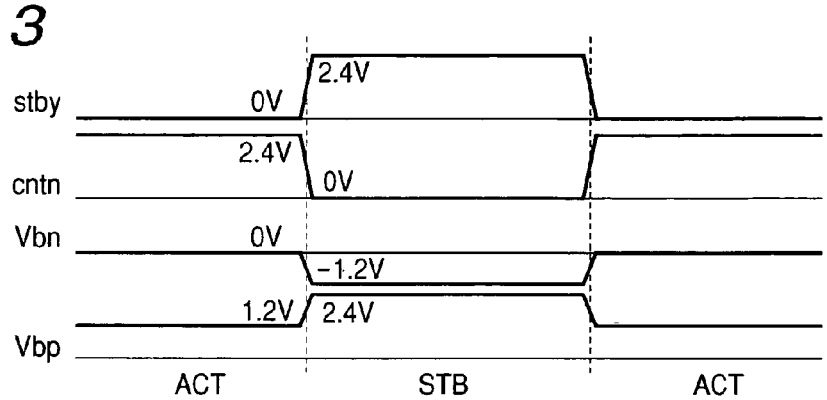
FIG. 3 is a diagram showing change in voltage of nodes in the circuit shown in FIG. 1.

FIG. 3 shows an example of the voltages of an active state ACT and a standby state STB of the parts of the circuit. The active state ACT represents a state that the logic circuit and the SRAM circuit are operated. The Vdd and the Vss in FIG. 1 are power sources of the core including the SRAM circuit and the logic circuit. The Vdd voltage is 1.2V and the Vss voltage is 0.0V. The standby signal stby is low in the active state. The control signal of the switch is high and the nMOS switch is on. The Vbn and the Vbp as the substrate voltages of the nMOS transistor and the pMOS transistor of the SRAM circuit are 0V and 1.2V. The substrate bias Vbs applied to the MOS transistor in the SRAM circuit is 0V. The threshold voltage of the MOS transistor constructing the SRAM circuit is not changed as compared with values determined by the transistor construction (gate width, gate length and implantation amount).

In the standby state, the standby signal stby is high. With it, the signal cntn controlling the nMOS switch is low and the nMOS switch is nonconductive. At the same time, the Vbn and the Vbp as the substrate voltages of the nMOS transistor and the pMOS transistor constructing the SRAM circuit are –1.2V and 2.4V. A substrate bias of 1.2V is applied to the MOS transistor in the SRAM circuit to increase the threshold voltage of the MOS transistor. The leakage current of the MOS transistor is reduced.

Figure 4:
FIG. 4 is a diagram showing an example of a control circuit CNTS in FIG. 1.

A circuit generating the signal cntn controlling the switch using the inputted standby signal stby can be realized by the simplified circuit as shown in FIG. 4.

Figure 5:
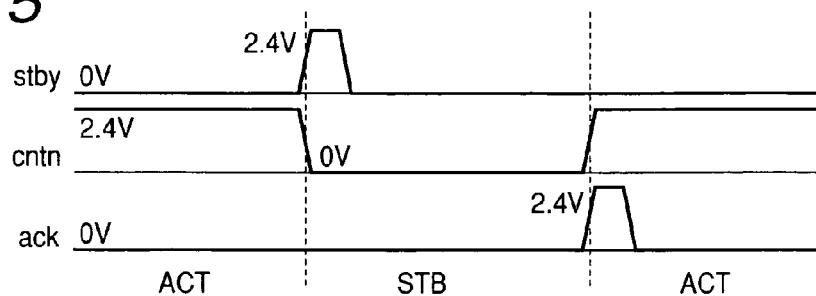
FIG. 5 is a waveform chart of signals for changing the state of the circuit of FIG. 1.

When using the circuit of FIG. 4, the high standby signal stby must be always inputted in the standby state STB, as shown in FIG. 3. For example, there is considered the case that the standby signal stby is inputted only in the standby state STB and an active signal ack is inputted when the standby state STB is changed to the active state. ACT. FIG. 5 shows the voltage change of the standby signal stby, the active signal ack and the control signal cntn in this case. When the standby signal stby is inputted, the control signal cntn is low to turn off the power switch, reducing the leakage current. When the active signal ack is inputted, the control signal cntn is high to make the power switch conductive, supplying power to the logic circuit.

Figure 6:
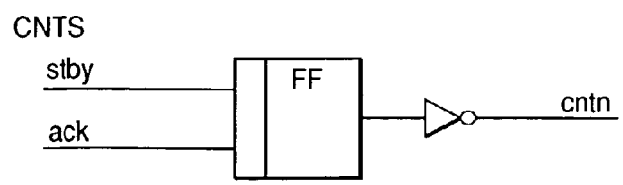
FIG. 6 is a diagram showing an example of a circuit generating signals shown in FIG. 5.

FIG. 6 shows the circuit CNTS for outputting the signals of the waveform of FIG. 5. To store the standby state STB in the circuit, a flip-flop is used. In this case, a signal for returning to the active state ACT is prepared.

Figure 7:
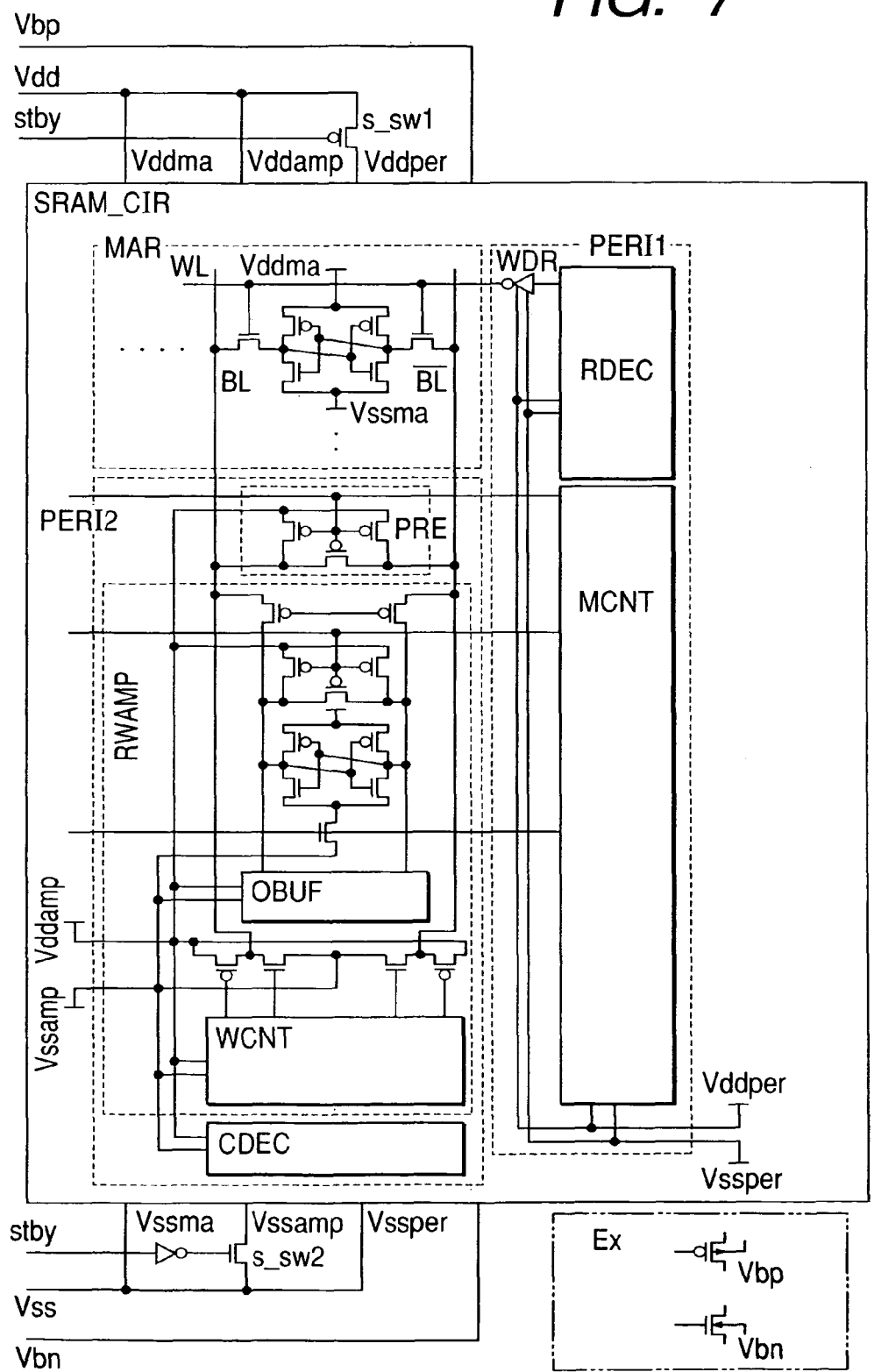
FIG. 7 is a diagram showing the relation between the internal construction of the SRAM circuit to which the present invention is applied and power sources thereof.

FIG. 7 shows a construction example of the SRAM circuit SRAM in FIG. 1. The SRAM circuit includes a memory cell array MAR, peripheral circuits PERI1 and PERI2 for accessing the memory cells, and an inverter to input an inverted signal of the signal stby transmitting the standby state to the gates of MOS transistor s_sw2 and s_sw1 and s_sw2m as switches for cutting off the power lines Vss and Vdd of the PERI1 or the PERI2. The substrate voltage of the P channel type MOS transistor included in SRAM_CIR is connected to the Vbp and the substrate voltage of the N channel type MOS transistor included therein is connected to the Vbn so as to control the substrate-bias voltage. The MAR is a circuit having the arrayed SRAM memory cells. The memory cell has a pair of flip-flops (a first and second P channel type load MOS transistors and a first and second N channel type drive MOS transistors) having the input and the output of a CMOS inverter interconnected, and a first and second N channel type transfer MOS transistors connected between two storage nodes and bitlines (BL, /BL) of the flip-flops. The gate electrode of the N channel type transfer MOS transistor is connected to a wordline WL. The operating voltage of the memory cell is given by Vddma and Vssma.

The peripheral circuit PERI1 includes a circuit for controlling the wordline WL of the memory cell including a word driver WDR, a row decoder RDEC, and a memory controller MCNT. The operating voltage of the circuit included in the PERI1 is given by Vddper and Vssper.

The peripheral circuit PERI2 includes a circuit for controlling a bitline BL of the memory cell including a pre-charge circuit PRE, a read/write amplifier RWAMP as a read/write control circuit connected to the bitline and a column decoder CDEC. The read/write amplifier RWAMP includes OBUF as an output buffer of a sense amplifier and WCNT as a control circuit of the write amplifier. The operating voltage of the circuit included in the PERI2 is given by Vddamp and Vssamp. A low signal is inputted to /stby in the drawing at the time of the standby STB. At the time of standby, the power line Vdd inputted to the PERI1 is cut off, and at the same time, the power line Vss inputted to the PERI2 is cut off. The Vbn and the Vbp supplying the substrate voltage of the MOS transistor constructing the MAR, PERI1 and PERI2 are controlled so as to increase an absolute value of the threshold voltage of the MOS transistor. The substrate bias is applied to the SRAM memory cell. The substrate bias is applied to the peripheral circuit. The power source is provided with the switch to reduce the leakage current. The power consumption of the SRAM at the time of standby can be reduced.

There will be described next a reason why the peripheral circuit is divided into two to cut off the Vss and the Vdd in FIG. 7. The wordline is low in the standby state and is low also in the operating state except for the selected wordline. The circuit driving the wordline cuts off the power source Vdd as the high voltage to reduce the leakage current when compared to cutting off the power source Vss as the low voltage. Time for returning from the standby state is shortened. The switch inserted in the Vdd side is smaller than that inserted in the Vss side. The bitline is typically charged to the Vdd in the SRAM. In many cases, the amplifier is of a construction in which the state charged to the Vdd is stable. The bitline is charged to the Vdd at the time of standby to cut off the power source Vss of the read amplifier and the write amplifier by the switch. The leakage current can be thus reduced. Time for returning from the standby state to the active state is shortened. In the circuit pre-charging the bitline to the Vdd, the Vss of the circuit driving the bitline is cut off, which is advantageous in the leakage current and the return time. In the circuit pre-charging the bitline to the Vss, cutting off the switch on the Vdd side is naturally advantageous, providing the construction.

The circuit in FIG. 7 is assumed to be the SRAM in the system LSI as shown in FIG. 1, and can be applied to a memory LSI without being limited to the system LSI. FIG. 7 is a diagram controlling the substrate bias of the SRAM circuit. When the leakage of the peripheral circuit can be reduced to sufficiently reduce the power consumption in the standby state, the substrate bias is not necessarily applied. In the case that the characteristic of the MOS transistor will be varied in the future to make the leakage current called a junction leakage of the MOS transistor larger than the leakage current called a sub-threshold of the MOS transistor, the method for controlling the substrate voltage may not reduce the leakage current. In this case, a construction in which the power sources of the logic circuit and the peripheral circuits of the SRAM in the system LSI are cut off by the switches can be thought to be an important technology.

Figures 8, 9:
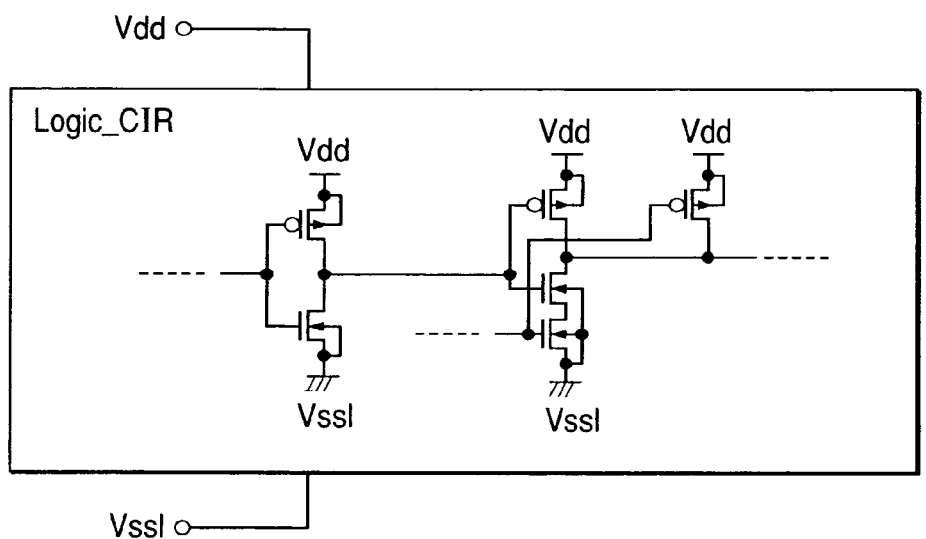
FIG. 8 is a diagram showing the construction of the logic circuit to which the present invention is applied.
FIG. 9 is a diagram showing the constructions of transistors of the system LSI to which the present invention is applied.

FIG. 8 shows a construction example of the logic circuit LOGIC in FIG. 1. In a logic circuit LOGIC_CIR, the logic gates such as NAND and NOR as the inverter having the P channel type MOS transistor and the N channel type MOS transistor are combined for multiple-stage connection. The substrate voltage is not applied to the transistor in the logic circuit. The substrate voltage of the P channel type MOS transistor is connected to the high voltage side Vdd of the operating voltage and the substrate voltage of the N channel type MOS transistor is connected to the low voltage side Vssl of the operating voltage.

Figure 16:
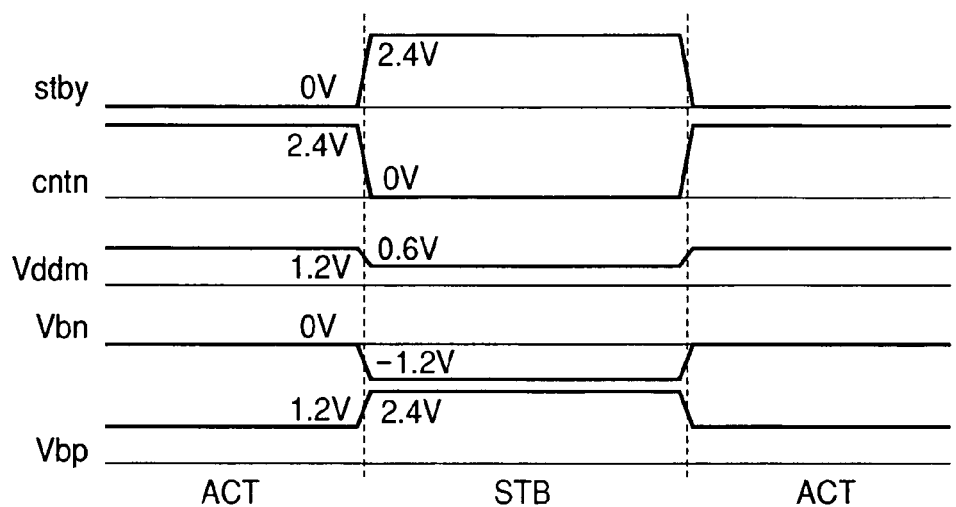
FIG. 16 is a diagram showing change in voltage of nodes in the circuit shown in FIG. 15.

FIG. 9 shows the constructions of the types of a MOS transistor for use in the logic circuit and the SRAM circuit (CORE) in the LSI, a MOS transistor for use in the input/output circuit IO of the LSI, a MOS transistor for use in the switch logic sw cutting off the power source of the logic circuit shown in FIG. 1, and a MOS transistor for use in the switch s_sw cutting off the power sources of the peripheral circuits of the SRAM shown in FIG. 7. The threshold voltages of the P channel type. MOS and the N channel type MOS transistors are different. The polarity is typically inverted to be designed to be the same value. FIG. 16 shows its absolute value. A transistor having a large insulating film thickness is used for the input/output circuit part of the LSI. A transistor having a small insulating film thickness is used for the internal logic circuit. In this drawing, there are used a MOS transistor having a large insulating film thickness of 6.7 nm and a MOS transistor having a small insulating film thickness of 2.0 nm. As the transistor having a small film thickness, a MOS transistor having two or more threshold voltages depending on a difference in impurity amount is often used.

In FIG. 9, a MOS transistor having two threshold voltages Vth of 0.40V and 0.25V is taken as an example. The current at the time of operation of the MOS transistor having a low threshold voltage is large and the leakage current at the time of standby is increased. In all the combinations, the MOS transistor of a thin gate-insulating film having two types of Vth is used for the logic circuit LOGIC_CIR and the SRAM circuit SRAM_CIR except for the control switch, and the MOS transistor of a thick gate-insulating film having a high Vth is used for the IO. In the LOGIC_CIR, a transistor having a low threshold value is used for a critical path and a transistor having a high threshold value is used for the remaining circuits. In the SRAM_CIR, to reduce the leakage current and to maintain static noise margin (SNB), a transistor having a high threshold value is used for the memory cell array MAR. Since the peripheral circuit PERI including the pre-charge circuit, the sense amplifier, the word driver and the decoder must be fast, a MOS transistor having a low threshold value is used.

In the combination of Pattern1, the thick-film MOS transistor having a high Vth is used for the power switch of the logic circuit, and the thin-film MOS transistor having a high Vth is used for the power switch of the peripheral circuit in the SRAM circuit. The thick-film MOS transistor is used for the power switch of the logic circuit to reduce the leakage current of the large-scale circuit. The SRAM controls the substrate bias to reduce the leakage current. The thin-film MOS transistor having a slightly large leakage is used for the power switch to reduce the entire leakage current.

When the circuit size of the peripheral circuit in the SRAM circuit is not large, the leakage current of the peripheral circuit is considered to be small. The construction of the Pattern1 is effective. When designing the SRAM circuit as a module which can be easily reused, the SRAM circuit can be designed in consideration of the characteristic of only the thin-film MOS transistor. The switch is made by the thin-film MOS transistor to enhance the design efficiency.

The construction of the Pattern1 is effective when the size of the SRAM circuit itself is not large, the size of the peripheral circuit in the SRAM circuit is not large, reduction of the leakage current is highly expected by controlling the substrate bias, or the design efficiency of the SRAM is considered.

In the combination of Pattern2, the thick-film MOS transistor having a high Vth is used for the power switch of the logic circuit and the power switch of the peripheral circuit in the SRAM circuit. This can reduce the leakage current of the circuit other than the SRAM memory cell in the LSI. The power consumption at the time of standby is smaller than that of the Pattern1. When designing the SRAM circuit, the characteristic of the thick-film MOS transistor must be considered. The design efficiency is thus lowered. The combination of the Pattern2 is effective when the size of the SRAM circuit is large, the size of the peripheral circuit of the SRAM is large, or an effect for reducing the leakage current by controlling the substrate bias is not highly expected.

In the combination of Pattern3, the thin-film MOS transistor having a high Vth is used for the power switch of the logic circuit and the power switch of the peripheral circuit in the SRAM circuit. In this case, the thin-film MOS transistor is used. An effect for reducing the leakage current is lower than that of the Pattern2. Since the characteristic of the thick-film MOS transistor need not be considered, the design efficiency is enhanced. The combination of the Pattern3 is effective when the effect for reducing the leakage current of the LSI is less large and the design efficiency is required.

As described above, the power source of the logic circuit is cut off by the switch in the standby state and the substrate bias is applied to the SRAM circuit. The leakage current of the system LSI is lowered to reduce the power consumption in the standby state.

Embodiment 2

Figure 10:
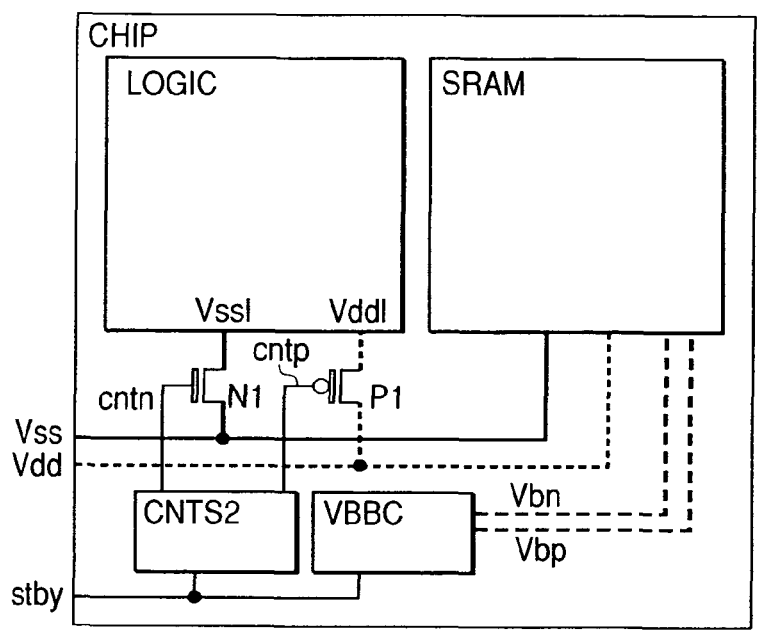
FIG. 10 is a diagram showing a first modification of the switches of the logic circuit.

This embodiment shows a modification of the power switch for use in the logic circuit. FIG. 10 shows a circuit block diagram when the power switch mounted only on the power source Vss of the logic circuit part in the circuit of FIG. 1 is provided in the power sources Vdd and Vss. The two power sources Vdd and Vss of the logic circuit are provided with the switch to cut off the power source. The area is increased by providing the power switch. The leakage current at the time of standby can be cut off more reliably. FIG. 1 illustrates the IO circuit, but is omitted in FIG. 10. The 10 circuit in the CHIP is omitted in other drawings.

Figure 11:
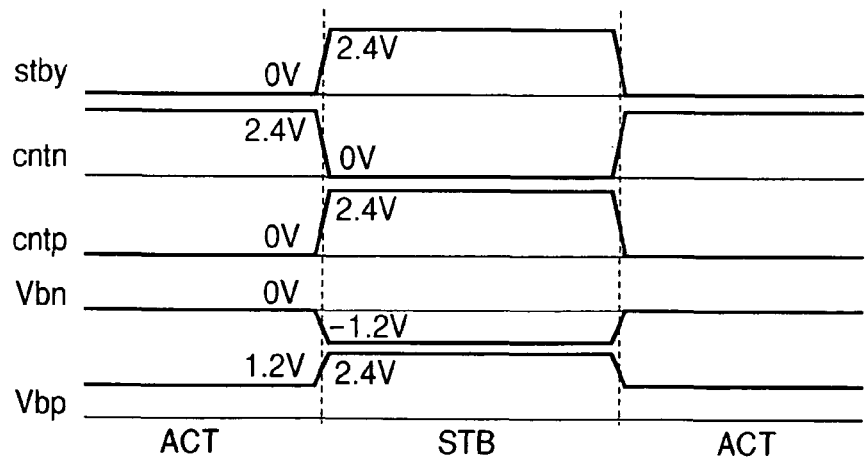
FIG. 11 is a diagram showing change in voltage of nodes in the circuit shown in FIG. 10.

FIG. 11 shows the voltages of the parts of the circuit when using the circuit of FIG. 10. In this drawing, a signal cntp controlling P1 of the pMOS as a switch for cutting off the Vdd of the logic part is added to the voltages of FIG. 3. The cntp is low in the active state ACT and is high in the standby state STB. The internal circuit of a circuit CNTS2 outputting the control signal in FIG. 7 is not particularly described. A circuit outputting a phase reversal signal can be added to the circuit of FIG. 4 or FIG. 6.

Figure 12:
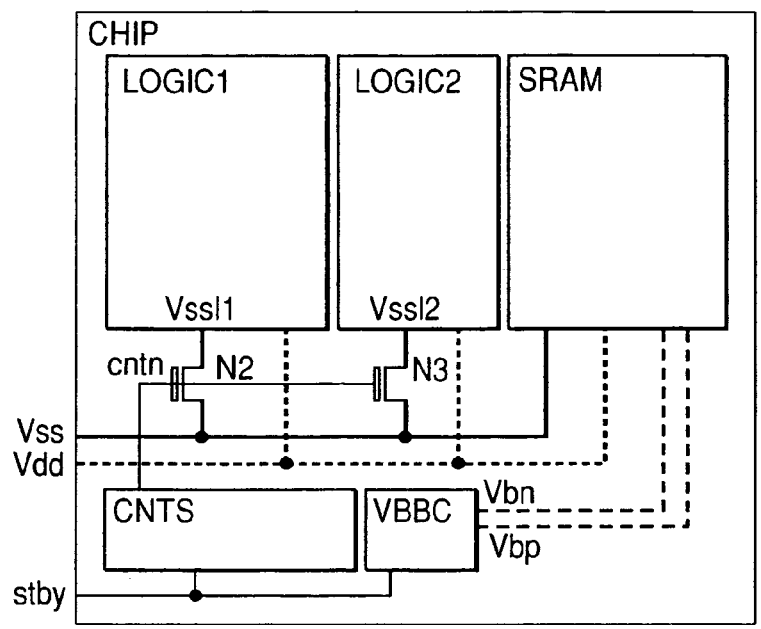
FIG. 12 is a diagram showing a second modification of the switches of the logic circuit.

In FIGS. 1 and 10, the circuit when the logic circuit in FIG. 1 is unified is described. FIG. 12 shows a block diagram of a circuit when the present invention is applied to the LSI in which the logic circuit is divided into two or more blocks. FIG. 12 shows an example when the logic circuit is divided into two blocks. When it is divided into three or more blocks, the same construction can be applied. The memory consolidated LSI shown in FIG. 12 has logic circuits LOGIC1 and LOGIC2, ground voltage power lines Vssl1 and Vssl2 of the LOGIC1 and the LOGIC2, switches N2 and N3 connecting the Vssl1 and the Vssl2 to the power line Vss of the entire LSI, the static memory circuit SRAM, the control circuit CNTS of the switch, and the circuit VBBC controlling the substrate voltage of the SRAM. It is of the same construction as the circuit of FIG. 1 except that there are a plurality of logic circuits and the operation is the same as that of the circuit of FIG. 1. The logic circuit is divided into a plurality of blocks which are provided with a switch cutting off the power source. An optimum switch can be added to each of the blocks. For example, an nMOS switch cutting off the Vss is added to some logic blocks and a pMOS switch cutting off the Vdd is added to other blocks. Otherwise, a switch cutting off the two power sources Vdd and Vss can be provided depending on the block.

Figure 13:
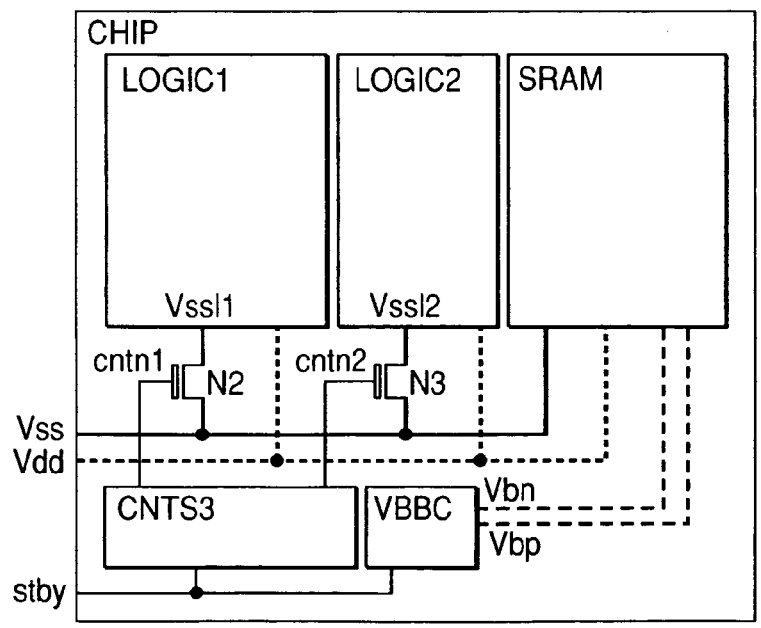
FIG. 13 is a diagram showing a third modification of the switches of the logic circuit.

In the memory consolidated LSI shown in FIG. 13, the power switch is added to each of the blocks of the logic circuit so that the power switch is controlled by other signals cntn1 and cntn2. The LSI has a control circuit CNTS3 which can separately control the control signals cntn1 and cntn2. These points are different from FIG. 12. The CNTS3 is a circuit which can control the control signals cntn1 and cntn2 of the power switch and permits control so that the switch N2 is cut off and the switch N3 is conductive depending on the operating state of the circuit. Thus, the block of the logic circuit which must be operated in the standby state is operated and the block of the logic circuit and the SRAM circuit which can be stopped are brought into the standby state, reducing the leakage current.

In FIG. 13, as in the case of FIG. 12, when there are three or more logic blocks, it is possible to make a combination cutting off the power source on the Vss side, the power source on the Vdd side or both for each of the blocks. In the construction of FIG. 13, the power supply for each of the blocks is controlled so as to bring the standby state, that is, the low leakage state. Not only in the standby state but also in the active state, the power switch is controlled so that the logic circuit and the SRAM circuit which need not be operated are brought into the standby state, minimizing the leakage current.

Figure 14:
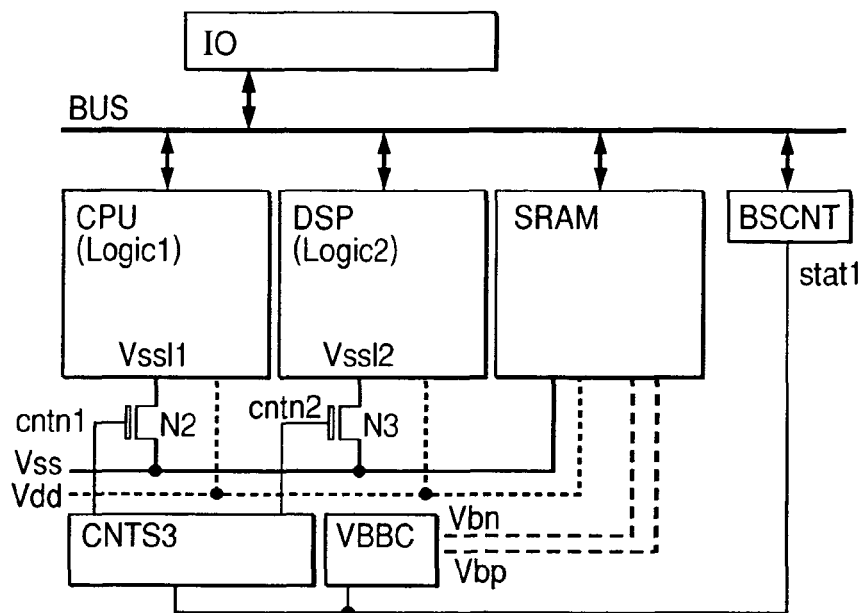
FIG. 14 is a diagram of an application of FIG. 13.

FIG. 14 shows an example in which the embodiment of FIG. 13 is applied to a system (microcomputer) equipped with a central processing unit. The system LSI has a logic circuit block CPU called a central processing unit CPU permitting various arithmetic operations, a logic circuit block DSP dedicated for digital signal operation, a static memory block SRAM circuit, a bus BUS connecting the blocks exchanging data, a circuit BSCNT controlling the bus, and a circuit IO exchanging data with outside. The respective blocks exchange data via the bus in the active state. Whether the bus is operated or not is found by monitoring the operating state of the bus. For example, when the entire circuit is not operated, the circuit BSCNT controlling the bus transmits that all the blocks are in the standby state, to the control circuit CNTS3 of the switch by a signal stat1. The CNTS3 makes the cntn1 and the cntn2 low to cut off the switches N2 and N3, reducing the leakage current of the logic circuit. At the same time, the VBBC controls the Vbn and the Vbp as the substrate voltages of the SRAM to lower the leakage current of the SRAM, reducing the leakage current of the entire circuit.

When only the CPU is operated and there is no access to the DSP and the SRAM via the bus, the BSCNT outputs the information via the stat1 to allow the substrate voltage of the SRAM to be in the standby state, to cut off the power switch N3 of the DSP to allow the DSP to be in the standby state, and allows only the CPU to be in the active state.

Embodiment 3

Figure 15:
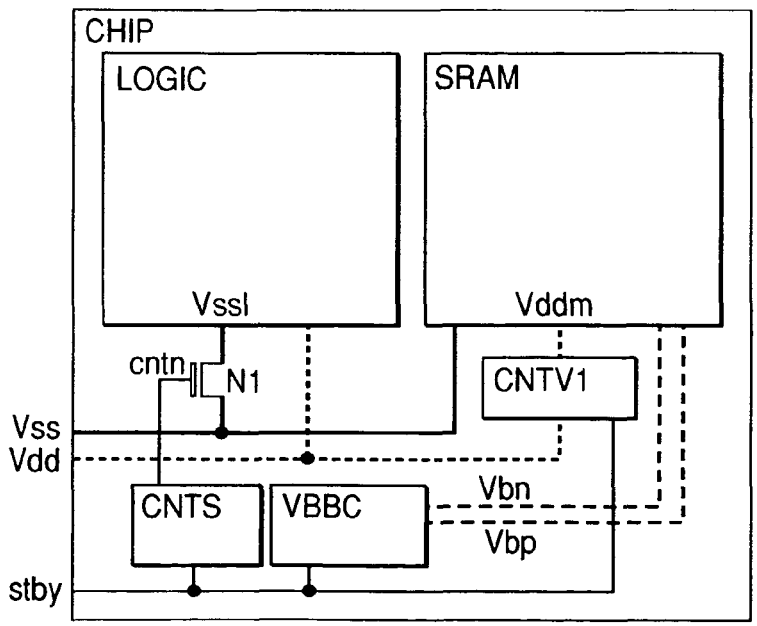
FIG. 15 is a diagram in which a voltage dropping circuit is applied to the SRAM circuit.

FIG. 15 schematically shows the entire construction of the LSI consolidating the logic circuit and the SRAM circuit using the present invention. The CHIP as the consolidated LSI includes the logic circuit LOGIC; the static memory circuit SRAM; the nMOS transistor N1 as a switch between the ground voltage line Vss from outside and the ground voltage line Vssl of the logic circuit; the control circuit CNTS to which the signal stby inputted in the standby state is inputted to be connected to the gate electrode of the N1 outputting the signal cntn controlling the N1; the substrate bias control circuit VBBC controlling the substrate voltages Vbn and Vbp of the SRAM when the stby is inputted; and a circuit CNTV1 controlling the power line Vddm of the SRAM by the stby signal.

The construction of FIG. 15 is the same as that of the circuit of FIG. 1 except for the CNTV1. Other than the CNTV1, it is operated as in FIG. 1. The CNTV1 is brought into the standby state and the stby signal is inputted. The source voltage of the SRAM is lower than the Vdd which can hold data from the Vdd. This controls the substrate voltage of the SRAM in the standby state to reduce the leakage current. Since the source voltage is lowered, the leakage current can be further reduced. The power consumption at the time of standby can be lower than that of the circuit of FIG. 1.

FIG. 16 shows the voltages at the time of active ACT and the time of standby STB of the parts of the circuit of FIG. 15. The voltage of the power source Vdd of the circuit exhibits 1.2V. The stby, cntn, Vbn and Vbp are the same as those of FIG. 3 as the operating voltages of FIG. 1. The source voltage Vddm of the SRAM is 1.2V at the time of active ACT which is the same as the source voltage and is 0.6V at the time of standby STB. This can reduce the leakage current in the SRAM.

The power source control circuit CNTV1 in FIG. 15 can be realized by the circuit of FIG. 16. The CNTV1 has a voltage dropping circuit PDC and a circuit changing switch. When the SRAM circuit is in the active state ACT, the circuit changing switch connects the power line Vddm supplying the operating voltage to the memory cell in the SRAM circuit to the power source Vdd supplied from outside so that the source voltage of the SRAM circuit is equal to the Vdd. In the standby state STB, the signal stby switches the circuit changing switch to connect Vddlow which is above the voltage lower than the Vdd produced by the voltage dropping circuit holding data in the memory cell of the SRAM and the power source Vddm of the SRAM circuit. The source voltage of the SRAM circuit is lower than the Vdd. In FIG. 15, the voltage is dropped on the high voltage side. The power source control circuit CNTV1 is connected between Vssm and the Vss so that the CNTV1 can be a voltage raising circuit. The raised voltage or a combination of the raised and dropped voltages on the low voltage side can obtain the same effect.

Embodiment 4

Figure 18:
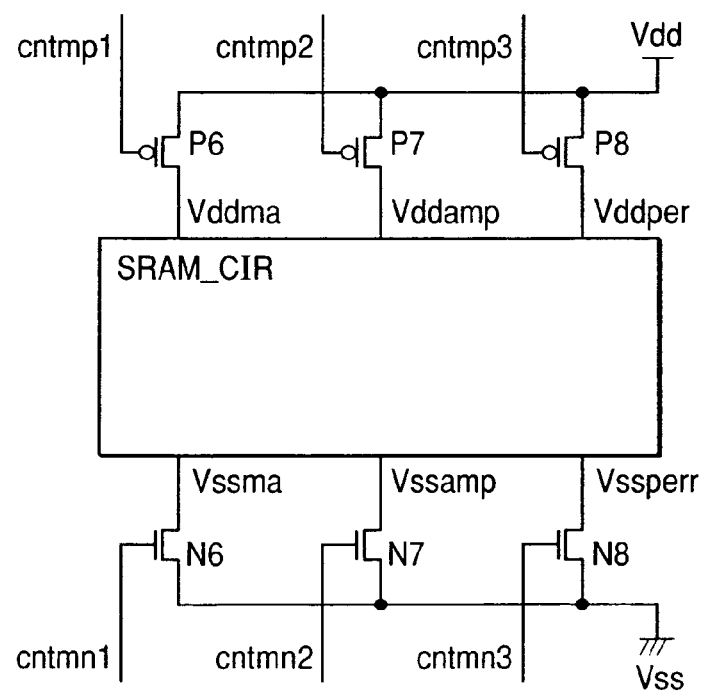
FIG. 18 is a first modification of the SRAM circuit of FIG. 7.

FIG. 18 shows a modification of the circuit of FIG. 7. In FIG. 7, the power sources of the memory cell array are the Vddma and the Vssma, the power sources of the circuit RWAMP including the circuit driving the bitline are the Vddamp and the Vssamp, and the power sources of other circuits are the Vddper and the Vssper. The power source in the SRAM circuit is divided into three systems. A switch having the N channel type MOS transistor is inserted between the peripheral circuit PERI2 for use in control of the bitline and the power source on the low voltage side. A switch having the P channel type MOS transistor is inserted between the peripheral circuit PERI1 for use in control of the wordline and the power source on the high voltage side. The switches are inserted in the high voltage side and the low voltage side of the three-system power sources to cut off the power sources at the time of standby. In this circuit, the switches constructed by the MOS transistor are inserted in all the power sources. At the time of standby, control signals cntmp1 and cntmp2 become low, a control signal cntmp3 becomes high, control signals cntmn1 and cntmn3 become high, and a control signal cntmn2 becomes low. Switches P6, P7, N6 and N8 are conductive to cut off switches P8 and N7, realizing the construction of FIG. 7. To hold information of the SRAM memory cell, the P6 and the N6 must be conductive at the time of standby. When the SRAM circuit is divided into blocks, as described later, use of the construction cutting off the P6 and the N6 in the block which need not hold the information is effective in low power consumption.

Without allowing the signal cntmn2 applied to the switch controlling the Vssamp at the time of standby to be low, the cntmp2 is allowed to be high. It is possible to realize a circuit cutting off the power source on the Vdd side of the read/write amplifier which is considered to be used in the circuit pre-charging the bitline to be low. In the circuit shown in FIG. 18, some kinds of circuits can be realized depending on the control method of the control signal.

Figure 19:
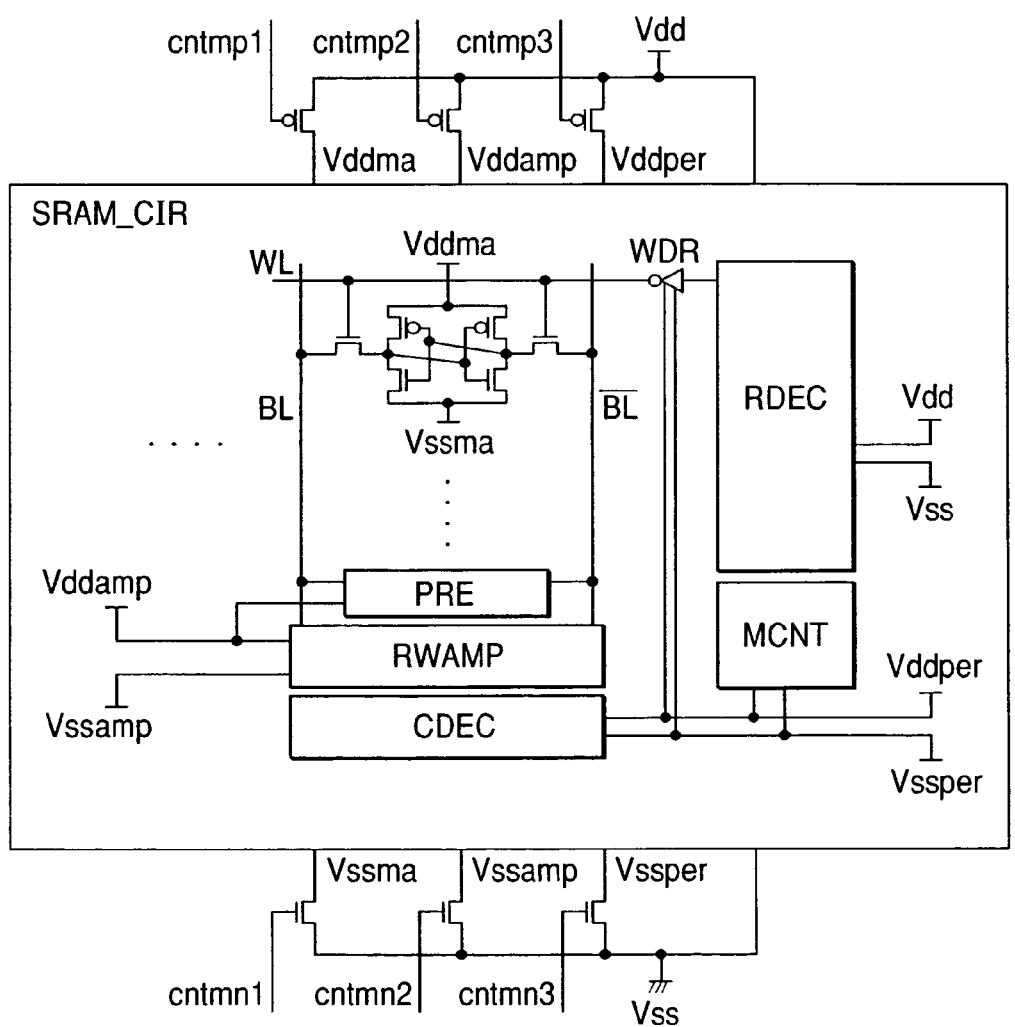
FIG. 19 is a second modification of the SRAM circuit of FIG. 7.

FIG. 19 shows a circuit which partly modifies of the circuit of FIG. 7. The power source of the column decoder CDEC is connected to the Vddper and the Vssper. In FIG. 7, the column decoder CDEC cuts off the power source on the Vss side. The column decoder is arranged near the amplifier. When the same switch as that of the amplifier cuts off the power source, the circuit design is considered to be facilitated. The power source is shared between the column decoder and the circuit controlling the wordline to cut off the power source of the Vdd side. Unless the design of the power source arrangement is complicated, the Vdd side can be cut off. The column decoder controls the bitline and has many nodes having the low voltage at the time of operation as in the word driver WDR (the number of the selection lines is larger than that of the non-selection lines). It is advantageous to provide the same operating voltages Vddper and Vssper as those of the memory controller MNCT using the switch on the high voltage side. By the same reason, although not shown, the control circuit WCNT of the write amplifier is desirably connected to the Vddper and the Vssper.

In FIG. 19, there are prepared the switches for the three-power sources of FIG. 18 (the switches of the P channel type MOS transistors provided between the Vdd and the Vddma, and the Vddamp and the Vddper; and the switches of the N channel type MOS transistors provided between the Vss and the Vssma, and the Vssamp and the Vssper) and the power line not via the switch. For the construction, depending on whether the switch for cutting off is provided on the low voltage side or the high voltage side, the SRAM circuit is blocked. The P channel type MOS transistor connected to the Vddamp and the N channel type MOS transistor connected to the Vssper can be omitted.

In this circuit, unlike FIG. 7, the power source connected to the row decoder RDEC is directly connected to the power sources Vdd and Vss outside the SRAM circuit, not to the cuttable power source in the SRAM circuit. Power is supplied to the row decoder at the time of standby. This prevents the transfer MOS in the memory cell from being conductive due to noise on the wordline caused by a time difference in power supply at the time of returning from the standby state.

The noise is produced because the power source of the previous-stage circuit of the power source of the word driver rises quickly to input a low signal to the word driver, and then, the word driver outputs a high signal. Power is supplied to the row decoder at the time of standby. The low signal is not inputted to the word driver. The noise cannot be provided on the wordline.

In FIG. 19, the power source of the entire row decoder is directly connected to the power sources Vdd and Vss supplied from outside. The circuit construction cannot reduce the leakage current of the row decoder. Although not shown, the power source of the entire row decoder is not connected to the Vdd and the Vss. The Vdd and the Vss are connected only to the previous-stage circuit of the word driver, e.g., the NAND circuit. There can be considered a circuit construction in which the power source cut off by the switch is connected to other circuits of the row decoder. The circuit construction can reduce the leakage current. The power source arrangement in the row decoder is complicated so that the design is difficult. When the size of the row decoder in the SRAM circuit is relatively large and the leakage current of the row decoder must be reduced, the power sources Vdd and Vss supplied from outside are connected only to the previous-stage circuit of the word driver. The power source which can cut off the power source at the time of standby by the power switch is connected to other circuits of the row decoders. When the size of the row decoder is not large and the influence of the leakage current of the row decoder is less, all the power sources of the row decoder are connected to the Vdd and the Vss. This construction is considered to be effective.

As shown in FIG. 19, the power source of the peripheral circuit of the SRAM is divided by function for control to reduce the leakage current of the peripheral circuit of the SRAM.

Embodiment 5

Figure 20:
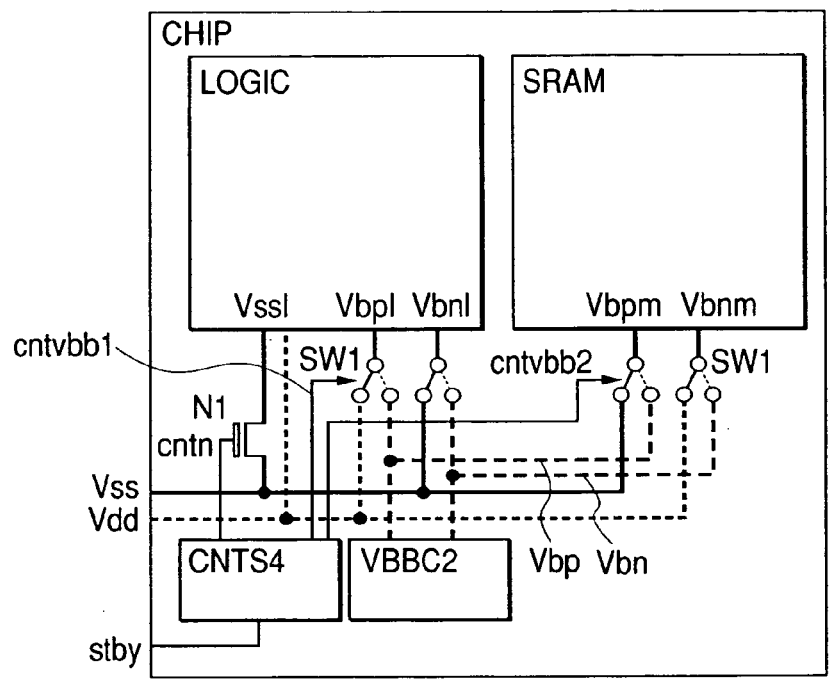
FIG. 20 is a diagram in which substrate bias control is applied to the logic circuit.

FIG. 20 shows a construction diagram in which the LSI consolidating the logic circuit and the SRAM circuit of FIG. 1, substrate bias control is performed not only to the SRAM circuit but also to the logic circuit. The CHIP as the consolidated LSI includes the logic circuit LOGIC; the static memory circuit SRAM; the nMOS transistor N1 as a switch between the power source Vss and the ground voltage line Vssl of the logic circuit; a switch SW1 selecting, to which Vdd, Vss, Vbn and Vbp, the substrate voltage lines Vbnl, Vbpl, Vbnm and Vbpm of the MOS transistor constructing the logic circuit and the SRAM circuit are connected; a control circuit CNTS4 outputting the signal cntn controlling the N1 and signals cntvbb1 and cntvbb2 controlling the switch SW1; and a substrate bias control circuit VBBC2 producing the substrate bias Vbn and Vbp.

The voltages of the parts at the time of active and standby are shown in FIG. 3. At the time of standby, the power source of the logic circuit is cut off. The substrate voltage of the logic circuit is controlled to reduce the leakage current of the logic circuit.

When the power switch of the logic circuit is made by the MOS transistor having a low threshold value, as shown in the Pattern3 of FIG. 9 and there is a leakage current in the power switch, the substrate bias is applied to reduce the leakage current of the logic circuit. The circuit is thus effective. In the circuit, the substrate voltages of the logic circuit and the SRAM circuit can be controlled independently. Only the SRAM circuit is allowed to be in the standby state and the logic circuit is allowed to be in the active state. When only the logic circuit is operated, the leakage current in the SRAM circuit can be reduced.

The substrate bias is applied to the logic circuit to operate the SRAM circuit, reducing the leakage current of the logic circuit. The switch which can select whether the substrate bias is applied to the logic circuit and the SRAM circuit is provided, permitting an operation to reduce the leakage current corresponding to the operating state.

The block controlling the substrate voltage is controlled finely. The substrate bias is applied to change the load amount varying the voltage. That is, when the switch is provided so as not to apply the substrate bias to the unnecessary parts, the load which must change the voltage is reduced. Time to change the voltage can be shortened.

Embodiment 6

Figure 21:
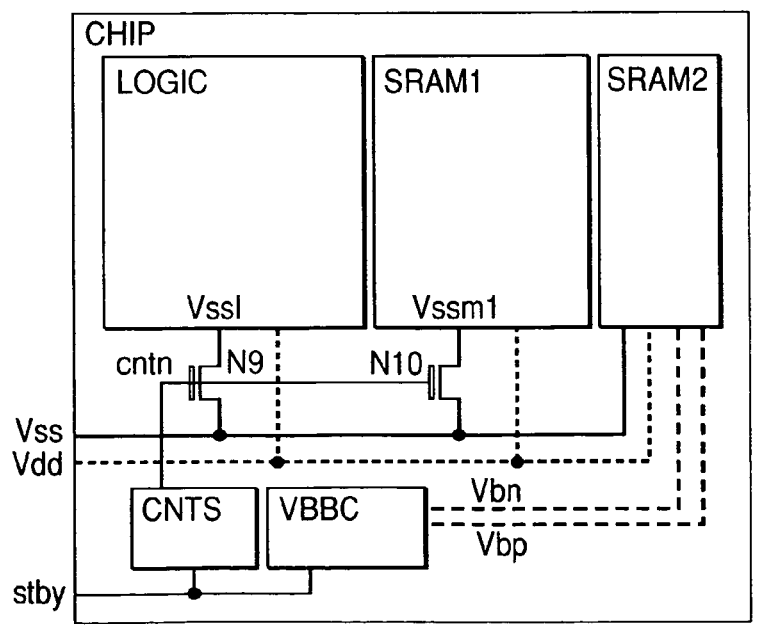
FIG. 21 is a diagram showing a first modification dividing the SRAM circuit part.
Figure 24:
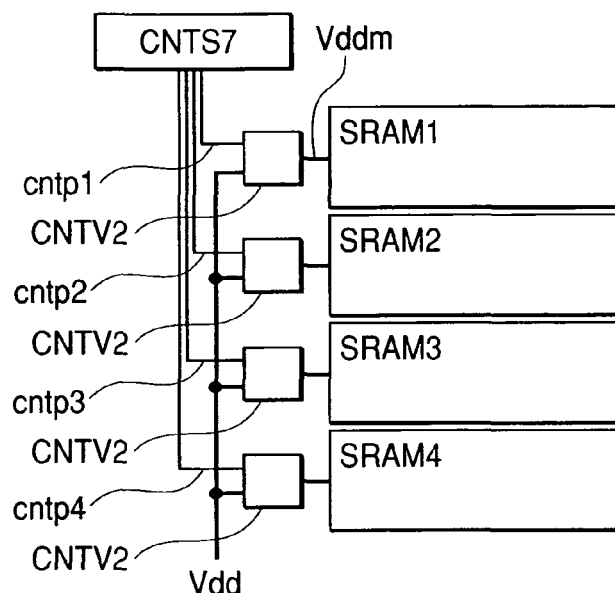
FIG. 24 is a diagram showing a second modification dividing the SRAM circuit.

FIG. 21 shows a first modification in which the SRAM circuit of FIG. 1 is divided into blocks. In FIG. 24, the CHIP as the consolidated LSI includes the logic circuit LOGIC; static memory circuits SRAM1 and SRAM2; an nMOS transistor N9 as a switch between the power source Vss and the ground voltage line Vssl of the logic circuit; an nMOS transistor N10 as a switch between the power source Vss and a ground voltage line Vssml of the SRAM1; the control circuit CNTS outputting the signal cntn controlling the N9 and the N10; and the substrate bias control circuit VBBC producing the substrate bias Vbn and Vbp. The SRAM circuits SRAM1 and SRAM2 can be of the same construction as that of FIG. 7 and the already described modification of FIG. 7.

In the circuit, the SRAM circuit of FIG. 1 is divided into two blocks of the SRAM1 and the SRAM2. At the time of standby, the power sources of the logic circuit and the SRAM1 are cut off and the substrate bias is applied to the SRAM2 to reduce the entire leakage current, reducing the power consumption at the time of standby. As compared with the circuit of FIG. 1, the leakage current of the circuit of the SRAM1 can be reduced. In the construction, however, data stored into the SRAM1 is erased at the time of standby. Data which must be stored at the time of standby must be stored into the SRAM2. In the system LSI, some SRAM blocks are consolidated so that blocks which must and need not hold data at the time of standby are often consolidated. In such circuit, the circuit construction is used to provide a large effect for reducing the leakage current.

Figures 22, 23:
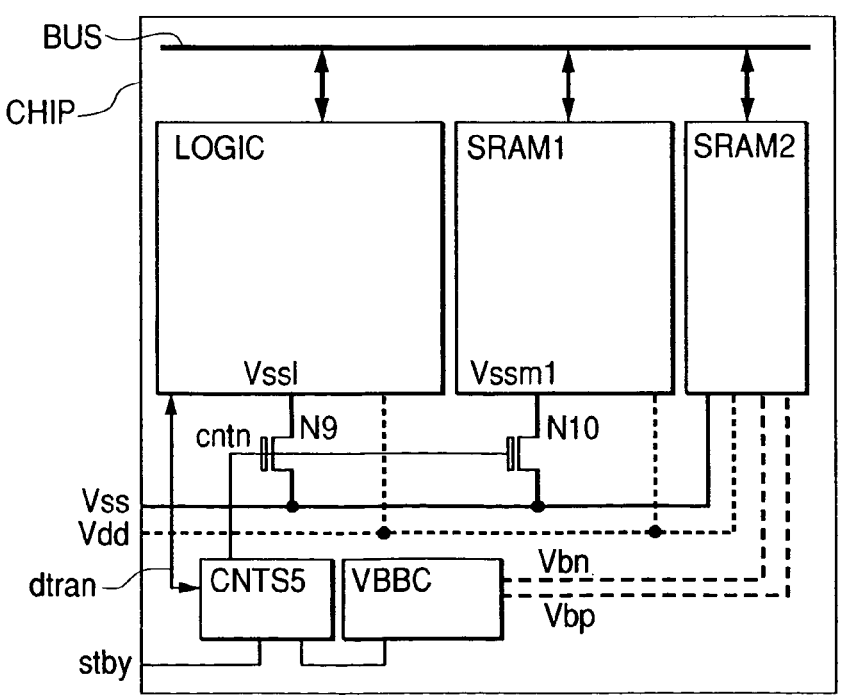
FIG. 22 is a diagram showing the constructions of transistors constructing a plurality of SRAM circuits in FIG. 21.
FIG. 23 is a diagram showing an application of the system of the invention of FIG. 21.

FIG. 22 shows a combination of the MOS transistors for use in the memory cell circuits of the divided two SRAM circuits. In the drawing, as in FIG. 9, the MOS transistor having a large insulating film thickness of 6.7 nm and the MOS transistor having a small insulating film thickness of 2.0 nm are used. As an example in which the MOS transistor with a small film thickness has two threshold voltages, the MOS transistor having two threshold voltages Vth of 0.40V and 0.25V is used. A MAR1 represents the MOS transistor of the memory cell of the SRAM1 cutting off the power source. A MAR2 represents the MOS transistor of the memory cell of the SRAM2 not cutting off the power source. As described in the table of FIG. 9, the MOS transistor having two threshold values is used for the logic circuit LOGIC_CIR. The MOS transistor having a low threshold value is used for about 10% in the logic circuit. They are allocated to the transistors in a critical path.

The MOS transistor of the peripheral circuit except for the memory cell of the SRAM is not shown. The MOS transistor having the same threshold value as the low threshold value of 0.25V of the logic circuit is used. The thin-film MOS transistor is used in any case. The IO represents the MOS transistor for use in the input/output circuit. The thick-film MOS transistor having a high threshold voltage is used in any of the combinations.

In a Pattern1, the thin-film MOS transistor having a high threshold voltage is used for the memory cell in all the SRAM circuit blocks. The construction is thought to reduce the area of the memory cell and has the excellent operating stability of the SRAM.

In a combination of the Pattern2, the SRAM memory cell to which the power switch is not added is made by the thick-film MOS transistor having a small leakage current to reduce the leakage current. In the combination, the transistor constructing the memory cell in the SRAM1 including the power switch is made by the thin-film MOS transistor. The area is small and the operation is fast. The leakage current can be reduced by the power switch.

The transistor constructing the memory cell in the SRAM2 not including the power switch is made by the thick-film MOS transistor. The leakage current at the time of standby can be reduced. The area of the memory cell of the SRAM2 is considered to be increased. The transistor is used in the circuit in which the circuit area is not cared much and the leakage current must be reduced reliably. The highest advantage of the circuit is thus obtained. When the circuit size of the SRAM2 is small, the combination is effective.

In a Pattern3, the memory cell of the SRAM1 is made by the thin-film MOS transistor having a low threshold voltage. The memory cell of the SRAM2 is made by the thin-film MOS transistor having a high threshold voltage. When the threshold value of the MOS transistor constructing the memory cell of the SRAM is lowered, there are problems that the leakage current is made higher to increase the power consumption at the time of standby and the operating margin of the SRAM itself is lost so as not to operate the memory cell itself. The former problem can be avoided by providing the power switch. The combination can be realized only when using the MOS transistor having a characteristic so as not to exhibit the latter problem significantly.

In a Pattern4, the thick-film MOS transistor is used as the MOS transistor constructing the SRAM2 memory cell of the combination of the Pattern3. This increases the circuit area than that of the Pattern3. The leakage current can be reduced.

FIG. 23 shows an application of FIG. 21. The CHIP as the consolidated LSI includes the logic circuit LOGIC; the static memory circuits SRAM1 and SRAM2; the BUS as a bus transferring data between the logic circuit and the SRAM circuit; an nMOS transistor N9 as a switch between the power source Vss and the ground voltage line Vssl of the logic circuit; the nMOS transistor N10 as a switch between the power source Vss and the ground voltage line Vssml of the SRAM1; a control circuit CNTS5 outputting the control signals cntn and dtran in the standby state; and the substrate bias control circuit VBBC producing the substrate bias Vbn and Vbp.

Typically, in the system LSI, data is exchanged between the logic circuit and the SRAM circuit via the bus. The bus is considered to exist in the circuit of the system LSI of FIG. 21. The circuit of FIG. 23 is different from the circuit of FIG. 21 in that it has the CNTS5 as the control circuit in the standby state. The operation of the circuit and the operation of the bus will be described.

When the LSI is allowed to be in the standby state, the control circuit CNTS5 controls the logic circuit using the control signal dtran to escape data in the SRAM1 which must be stored at the time of standby to the SRAM2 via the bus. Upon completion of the escape, the escape completion is transmitted to the control circuit CNTS5 via the dtran. The control circuit CNTS5 outputs a signal for change to the standby state to cut off the power sources of the logic circuit and the SRAM1 by the switch. Then, the substrate bias to reduce the leakage current is applied to the SRAM2. For returning from the standby state to the active state, the control circuit CNTS5 outputs a signal to supply power to the logic circuit and the SRAM1, and then, the substrate bias in the standby state of the SRAM2 is switched to the bias in the active state. When the source voltages of the logic circuit and the SRAM1 and the substrate voltage of the SRAM2 are stable, the circuit controlling the bus via the control signal dtran is controlled to restore data of the SRAM1 escaped to the SRAM2. The circuit can hold data which must be held at the time of standby and reduce the leakage current of the memory cell of data which need not be held.

Figure 17:
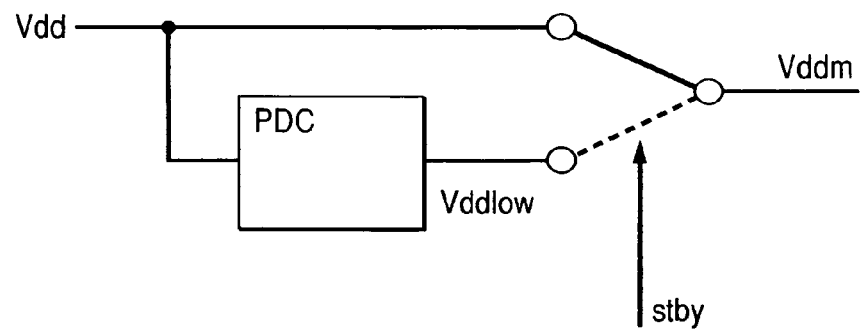
FIG. 17 is a circuit diagram of a switch circuit CNTV1 in FIG. 16.

FIG. 24 shows the SRAM circuit of a second modification in which the SRAM circuit is divided into blocks and its power source control circuit part. In FIG. 15, the CNTV1 controls the voltage on the high voltage side of the SRAM circuit by one voltage dropping circuit. Optimum control (The voltage of the SRAM1 is dropped and the voltage of the SRAM2 is not dropped since read and write operations are performed) can be performed for each of the blocks by dividing the SRAM circuit. As in the case of FIG. 15, the voltage is not dropped on the high voltage side and the raised voltage or a combination of the raised and dropped voltages on the low voltage side can obtain the same effect. The circuit shown in FIG. 17 may be used for each CNTV2. The dropped voltage must be above the lowest voltage which can hold the memory of the SRAM.

Figure 25:
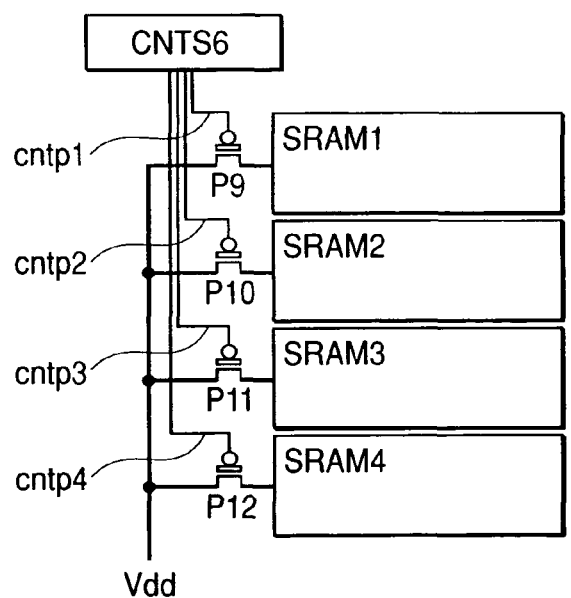
FIG. 25 is a diagram showing a third modification dividing the SRAM circuit.

FIG. 25 shows the SRAM circuit of a third modification in which the SRAM circuit is divided into blocks and its power source control circuit part. They have four SRAM blocks SRAM1, SRAM2, SRAM3 and SRAM4, switches P9, P10, P11 and P12 constructed by the P channel type MOS transistor cutting off the power sources of the blocks, and a control circuit CNTS6 controlling the power switches. At the time of standby, the power source of the block which needs to hold data is not cut off and the power source of the block which need not hold data is cut off. In the circuit construction, the leakage current of the SRAM circuit is produced only in the blocks which must hold data. An example of the P channel type MOS transistor is described. As described already, the construction substituting it for the N channel type transistor is advantageous in area efficiency.

In FIG. 21, the block not cutting off the power source is provided and information of another block which must hold information and cuts off the power source at the time of standby is transferred. This construction need not transfer data. Means for detecting whether information must be held or not is added. The means cuts off only the power switch of the block which need not hold information.

There is considered a control method of a control circuit CNTS6 in which the block into which necessary data is stored is stored and in the case of change to the standby state, the power source of the block in which no data is stored is cut off. In addition, there is considered a control method in which when making the circuit, the block cutting off the power source and the block not cutting off the power source are programmed to cut off the power source corresponding to the program. Further, there is considered a control method in which the power source of the block to be cut off during operation is programmed to cut off the power source of only the block which must cut off the power source. In this manner, change of the control methods of the control circuit CNTS6 can realize various power source cutting-off patterns.

Figure 26:
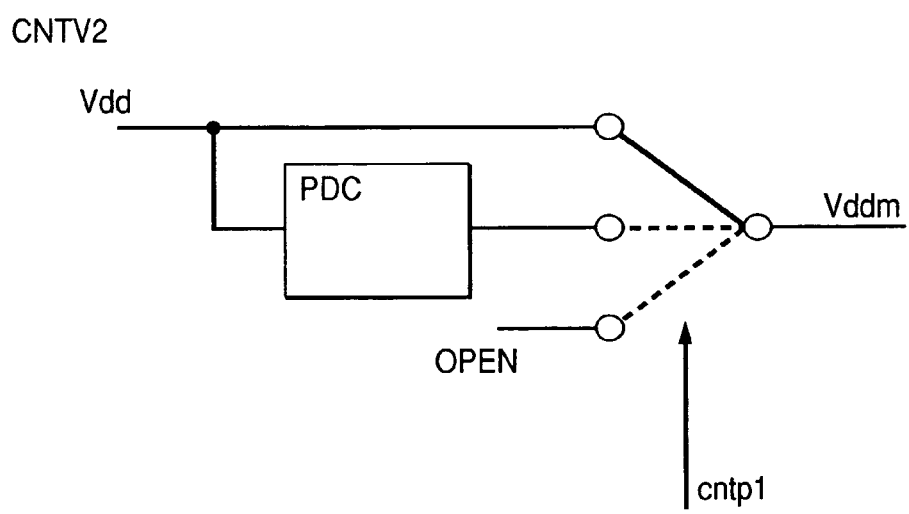
FIG. 26 is a diagram showing a circuit construction example of a power source control circuit CNVT2 in FIG. 24.

In FIG. 26, the CNTV2 of FIG. 24 is a switch connected to any one of three power source states. The three power source states refer to a state connected to the source voltage Vdd supplied from outside, a state connected to the power source having a voltage lower than the Vdd which can hold data in the SRAM, and a state cutting off the power source. When the CNTV2 can be connected to the three power source states, the power sources of all the blocks are connected to the Vdd in the active state, the power source of the block which must hold data is connected to the power source having a voltage lower than the Vdd in the standby state, and the power source of the block which need not hold data is cut off. This can reduce the leakage current of the block which must hold data. The PDC in the drawing is a voltage dropping circuit and outputs a voltage lower than the power source Vdd in which the memory cell of the SRAM can hold data. In the circuit, corresponding to the value of the inputted control signal a cntp1, the switch is switched to connect the power source Vddm of the memory to the Vdd, the circuit dropping the voltage of the Vdd, or a state connected to nothing.

Use of the circuit of FIG. 25 can reduce the leakage current in the standby state. The power source of the SRAM block accessed in the active state is connected to the Vdd and the power source of the block not accessed is connected to the power source having a voltage lower than the Vdd. This can reduce the leakage current of the unnecessary SRAM block at the time of active. The CNTV2 can also be changed from the voltage dropping circuit to the voltage raising circuit, which can be inserted between the power line and the power source on the low voltage side of the memory cell. In FIGS. 24 and 25, the SRAM circuit is divided into four blocks. As the circuit construction, it can be applied when there are one or more blocks.

The MOS (Metal-Oxide-Semiconductor) transistor is described above. The MIS (Metal-Insulated-Semiconductor) transistor using no oxide film may be substituted. The same effect of the present invention is obtained.

According to the present invention, the LSI consolidating the logic circuit and the SRAM circuit can reduce the power consumption at the time of standby.

What is claimed is:

1. A semiconductor device comprising:
   a first line for a first voltage,
   a second line for a second voltage lower than the first voltage;
   a first P channel MOS transistor having a gate coupled to receive a first control signal and having a source-drain path;
   a second P channel MOS transistor having a gate coupled to receive a second control signal different from the first control signal and having a source-drain path;
   static memory cells, each static memory cell having a first operating voltage supply point which is coupled to the first line via the source-drain path of the first P channel MOS transistor;
   word lines coupled to the static memory cells;
   word drivers coupled to the word lines, each word driver having a second operating voltage supply point which is coupled to the first line via the source-drain path of the second P channel MOS transistor, respectively; and
   bit lines coupled to the static memory cells.

2. A semiconductor device according to claim 1, wherein each static memory cell includes:
   a flip-flop having a first storage node, a second storage node, a first CMOS inverter having an output coupled to the first storage node and an input coupled to the second storage node, and a second CMOS inverter having an output coupled to the second storage node and an input coupled to the first storage node, the first CMOS inverter including a first P channel load MOS transistor and a first N channel drive MOS transistor, the second CMOS inverter including a second P channel load MOS transistor and a second N channel drive MOS transistor; and
   first and second N channel transfer MOS transistors, each having a source-drain path coupled between a corresponding one of the first and second storage nodes and a corresponding one of the bit lines and having a gate electrode coupled to a corresponding word line,
   wherein the first and second P channel load MOS transistors have sources coupled to the first operating voltage supply point.

3. A semiconductor device according to claim 2, further comprising:
   a third P channel MOS transistor having a gate coupled to receive a third control signal and having a source-drain path; and
   a read/write amplifier coupled to the bit lines and having a third operating voltage supply point which is coupled to the first line via the source-drain path of the third P channel MOS transistor.

4. A semiconductor device according to claim 2, further comprising:
- a third P channel MOS transistor having a gate coupled to receive a third control signal and having a source-drain path; and
- a pre-charge circuit which includes:
  - fourth and fifth P channel MOS transistors having drains coupled to the bit lines, respectively, and sources which are coupled to the first line via the source-drain path of the third P channel MOS transistor, and
  - a sixth P channel MOS transistor having a source-drain path coupled between the drains of the fourth and fifth P channel MOS transistors.

5. A semiconductor device according to claim 2, wherein the first P channel MOS transistor and the second P channel MOS transistor are arranged at one side of a static random access memory including the memory cells, the word lines, the word drivers and the bit lines.

6. A semiconductor device according to claim 5, further comprising:
- a row decoder coupled to the word drivers,
- wherein the row decoder has a third operating voltage supply point different from the first and second operating voltage supply points.

7. A semiconductor device according to claim 6, wherein each static memory cell has a fourth operating voltage supply point which is coupled to the second line, and
wherein each word driver has a fifth operating voltage supply point which is coupled to the second line.

8. A semiconductor device according to claim 6, wherein each static memory cell has a fourth operating voltage supply point which is coupled to the second line, and
wherein the row decoder has a fifth operating voltage supply point which is directly coupled to the second line.

9. A semiconductor device according to claim 1, further comprising:
- a third channel MOS transistor having a gate coupled to receive a third control signal and having a source-drain path, and
- a logic circuit including N channel and P channel MIS transistors and having a third operating voltage supply point which is supplied with a power supply voltage via the source-drain path of the third P channel MOS transistor.

10. A semiconductor device according to claim 9, further comprising:
- a read/write amplifier coupled to the bit lines; and
- a column decoder coupled to the read/write amplifier,
- wherein the column decoder has the second operating voltage supply point.

11. A semiconductor device comprising:
- a first P channel MOS power switch having a gate coupled to receive a first control signal and having a source-drain path,
- a second P channel MOS power switch having a gate coupled to receive a second control signal different from the first control signal and having a source-drain path;
- a logic circuit including N channel and P channel MIS transistors and having a first operating voltage supply point which is supplied with a first power supply voltage via the source-drain path of the first P channel MOS power switch; and
- a static random access memory which includes:
  - static memory cells;
  - word lines coupled to the static memory cells;
  - word drivers coupled to the word lines, each word driver having a second operating voltage supply point which is supplied with a second power supply voltage via the source-drain path of the second P channel MOS power switch; and
  - bit lines coupled to the static memory cells.

12. A semiconductor device according to claim 11, wherein a thickness of a gate insulating film of the second P channel MOS power switch is greater than that of a gate insulating film of a P channel MIS transistor in the logic circuit.

13. A semiconductor device according to claim 11, wherein a thickness of a gate insulating film of the second P channel MOS power switch is the same as that of a gate insulating film of a P channel MIS transistor in the logic circuit.

14. A semiconductor device according to claim 11, wherein each static memory cell includes:
- a flip-flop having a first storage node, a second storage node, a first CMOS inverter having an output coupled to the first storage node and an input coupled to the second storage node, and a second CMOS inverter having an output coupled to the second storage node and an input coupled to the first storage node, the first CMOS inverter including a first P channel load MOS transistor and a first N channel drive MOS transistor, the second CMOS inverter including a second P channel load MOS transistor and a second N channel drive MOS transistor; and
- first and second N channel transfer MOS transistors, each having a source-drain path coupled between a corresponding one of the first and second storage nodes and a corresponding one of the bit lines and having a gate electrode coupled to a corresponding word line.

15. A semiconductor device according to claim 14, wherein a thickness of a gate insulating film of the second P channel MOS power switch is greater than that of a gate insulating film of the first P channel load MOS transistor.

16. A semiconductor device according to claim 14, wherein a thickness of a gate insulating film of the second P channel MOS power switch is the same as that of a gate insulating film of the first P channel type load MOS transistor.

17. A semiconductor device according to claim 11, further comprising:
- a third P channel MOS power switch having a gate coupled to receive a third control signal and having a source-drain path,
- wherein each static memory cell has a third operating voltage supply point which is supplied with a third power supply voltage via the source-drain path of the third P channel MOS power switch.

18. A semiconductor device according to claim 17, each static memory cell has first and second P channel load MOS transistors whose sources are coupled to the third operating voltage supply point.

19. A semiconductor device according to claim 18, further comprising:
- a row decoder coupled to the word drivers,
- wherein the row decoder has a fourth operating voltage supply point different from the second and third operating voltage supply points.

20. A semiconductor device according to claim 17, further comprising:
- a fourth P channel MOS power switch having a gate coupled to receive a fourth control signal and having a source-drain path; and
- a read/write amplifier coupled to the bit lines and having a fourth operating voltage supply point which is supplied with a fourth power supply voltage via the source-drain path of the fourth P channel MOS power switch.

21. A semiconductor device according to claim 17, further comprising:
- a fourth P channel MOS power switch having a gate coupled to receive a fourth control signal and having a source-drain path; and
- a pre-charge circuit coupled to the bit lines and having a fourth operating voltage supply point which is supplied with a fourth power supply voltage via the source-drain path of the fourth P channel MOS power switch.

22. A semiconductor device according to claim 17, wherein the second P channel MOS power switch and the third P channel MOS power switch are arranged at one side of the static random access memory.

23. A semiconductor device according to claim 22, further comprising:
- a read/write amplifier coupled to the bit lines; and
- a column decoder coupled to the read/write amplifier,
- wherein the column decoder has the second operating voltage supply point.

* * * * *